United States Patent
Koppikar et al.

(10) Patent No.: US 10,541,344 B2
(45) Date of Patent: Jan. 21, 2020

(54) TEXTURING RIBBONS FOR PHOTOVOLTAIC MODULE PRODUCTION

(71) Applicant: GCL System Integration Technology (Hong Kong) Limited, Kowloon (HK)

(72) Inventors: Sandeep Rammohan Koppikar, Bangalore (IN); Aditya Janardan Deshpande, Chesterfield, MO (US); Vikrant Ashok Chaudhari, Bangalore (IN); Eugene Rhee, Gaithersburg, MD (US); Dinesh Somabhai Amin, Clarksburg, MD (US)

(73) Assignee: GCL SYSTEM INTEGRATION TECHNOLOGY (HONG KONG) LIMITED, Hong Kong (CN)

( * ) Notice: Subject to any disclaimer, the term of this patent is extended or adjusted under 35 U.S.C. 154(b) by 58 days.

(21) Appl. No.: 15/540,842

(22) PCT Filed: Jan. 5, 2016

(86) PCT No.: PCT/US2016/012214
§ 371 (c)(1),
(2) Date: Jun. 29, 2017

(87) PCT Pub. No.: WO2016/112029
PCT Pub. Date: Jul. 14, 2016

(65) Prior Publication Data
US 2018/0026151 A1    Jan. 25, 2018

Related U.S. Application Data

(60) Provisional application No. 62/100,274, filed on Jan. 6, 2015.

(51) Int. Cl.
*H01L 31/05* (2014.01)
*H01L 23/00* (2006.01)
(Continued)

(52) U.S. Cl.
CPC .......... *H01L 31/0508* (2013.01); *H01L 24/29* (2013.01); *H01L 24/83* (2013.01);
(Continued)

(58) Field of Classification Search
CPC .................................................. H01L 31/0508
See application file for complete search history.

(56) References Cited

U.S. PATENT DOCUMENTS 5,411,897 A * 5/1995 Harvey ..................... B23K 1/20
136/256
5,998,729 A * 12/1999 Shiomi ................. H01L 27/142
136/251
(Continued)

OTHER PUBLICATIONS

International Search Report and Written Opinion of the International Search Authority regarding PCT/US2016/012214 dated Apr. 21, 2016; pp. 1-11.

*Primary Examiner* — William Coleman
(74) *Attorney, Agent, or Firm* — Oliff PLC (57) ABSTRACT

A method for texturing a photovoltaic module ribbon on a photovoltaic cell including a plurality of first electrodes on a first side and a plurality of second electrodes on a second side, and coupling a first photovoltaic module ribbon to the plurality of first electrodes. The method also includes positioning the photovoltaic cell on a textured base having a texture embodied thereon, where the first photovoltaic module ribbon is substantially contacting the texture. The method further includes coupling a second photovoltaic module ribbon to the plurality of second electrodes, and transferring the texture of the textured base to the first ribbon using heat energy released when the second photovoltaic module ribbon is coupled to the plurality of second electrodes.

10 Claims, 11 Drawing Sheets

(51) Int. Cl.
*H01L 31/18* (2006.01)
*H02S 40/22* (2014.01)
*H01L 31/054* (2014.01)

(52) U.S. Cl.
CPC ...... *H01L 31/0504* (2013.01); *H01L 31/0512* (2013.01); *H01L 31/0543* (2014.12); *H01L 31/0547* (2014.12); *H01L 31/188* (2013.01); *H02S 40/22* (2014.12); *Y02E 10/52* (2013.01)

(56) References Cited

U.S. PATENT DOCUMENTS

| | | | |
|---|---|---|---|
| 9,349,882 B2* | 5/2016 | Cho | H01L 31/022425 |
| 9,515,200 B2* | 12/2016 | Nakauchi | H01L 31/022425 |
| 2009/0277491 A1* | 11/2009 | Nakamura | H01L 31/022433 |
| | | | 136/244 |
| 2011/0271996 A1 | 11/2011 | Hahn et al. | |
| 2013/0048047 A1 | 2/2013 | Fujii et al. | |
| 2014/0048306 A1* | 2/2014 | Yang | H01B 5/02 |
| | | | 174/133 R |
| 2014/0144481 A1* | 5/2014 | Hayashi | H01L 31/0512 |
| | | | 136/244 |
| 2015/0004740 A1* | 1/2015 | Cho | H01L 31/022425 |
| | | | 438/65 |

* cited by examiner

TEXTURING RIBBONS FOR PHOTOVOLTAIC MODULE PRODUCTION

CROSS REFERENCE TO RELATED APPLICATIONS

This application is a National Stage application of International Application No. PCT/US2016/012214, filed on Jan. 5, 2016. International Application No. PCT/US2016/012214 claims priority to U.S. provisional patent application Ser. No. 62/100,274 filed on Jan. 6, 2015. The disclosure of both priority documents are hereby incorporated by reference as if set forth in their entirety.

BACKGROUND

The field of this disclosure relates generally to photovoltaic (PV) systems and, more specifically, to texturing PV module ribbons for PV module production.

Photovoltaic (PV) modules are devices which convert solar energy into electricity. Typically, a PV module includes several PV cells—connected in series and/or in parallel—that generate electricity in response to sunlight (or artificial light) incident on the surface of the cells by the photovoltaic effect.

In extracting the generated electricity, electrodes are manufactured on one or both faces of a semiconducting material (e.g., a crystalline silicon wafer) that at least partially forms the light-absorbing structure of the PV cell. Various techniques are known for manufacturing PV cell electrodes. In one such technique, electrodes include fingers and bus bars, and are screen printed onto a surface of the semiconducting material using silver (Ag) paste. Some other techniques include screen printing fingers from silver and soldering separate bus bars to the fingers. In yet other techniques, fingers are screen printed on the semiconducting material using silver.

During PV module production, PV cells are connected to each other by soldering conductive ribbons to the PV cell electrodes. The conductive ribbons electrically couple together the cells within a PV module and are sometimes referred to as tabbing, interconnect, or bus wire. An example conductive ribbon includes a copper (Cu) core coated with a tin-lead alloy (60Sn/40Pb) solder metal. These ribbons are soldered to the electrodes (e.g., the bus bars) on the front and back faces of the PV cells. The ribbons cover part of the surface of the cells and block some light from reaching the cell. The fraction of surface area of the cell that is covered up by these ribbons is a measure of the amount of useful light blocked from reaching the photoactive areas of the PV cell. In some cases, these ribbons reduce light incident on the photoactive areas of the PV cell by up to five percent.

Some known PV modules are produced using ribbons manufactured with textured copper or plastic films that are coated with faceted reflective surfaces. In some cases, these solutions increase cost, increase manufacturing complexity, and/or increase reliability problems of the PV module. It would be beneficial to reduce the amount of useful light blocked by PV module ribbons without substantially increasing the cost, complexity, or reliability of the PV module. This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF DESCRIPTION

In one embodiment, a method for directly imparting a light-capturing texture to a photovoltaic module ribbon on a photovoltaic cell including a plurality of first electrodes on a first side and a plurality of second electrodes on a second side is provided. The method includes coupling a first photovoltaic module ribbon to the plurality of first electrodes. The method also includes positioning the photovoltaic cell on a textured base having a light-capturing texture embodied thereon, where the first photovoltaic module ribbon is substantially contacting the light-capturing texture. The method further includes coupling a second photovoltaic module ribbon to the plurality of second electrodes. The method also includes transferring the light-capturing texture of the textured base to the first ribbon using heat energy released when the second photovoltaic module ribbon is coupled to the plurality of second electrodes.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols in the various drawings indicate like elements.

DETAILED DESCRIPTION

Systems and methods are provided herein for texturing photovoltaic (PV) module ribbons for PV module production and, more specifically, for texturing a PV module ribbon of a PV module by directly imparting a light-capturing texture to a surface of the PV module ribbon during manufacture of the PV module.

As used herein, an example photovoltaic (PV) module includes a plurality of photovoltaic (PV) cells electrically interconnected by one or more PV module ribbon. The PV module has a laminate structure including a plurality of layers such as, e.g., glass layers, non-reflective layers, electrical connection layers (e.g., including the one or more PV module ribbon), backing layers, layers including PV cells (e.g., the plurality of PV cells), and/or other suitable layers to enable the PV module to function as described herein. The PV module also includes a frame circumscribing the interconnected PV cells and/or other layers for providing structural support and/or protection of the PV module. The PV module frame may include elements for securing the PV module to a mounting structure, electrically coupling the PV module to other devices or to ground, coupling the PV module to one or more other PV modules to create a photovoltaic (PV) array, and any other suitable elements.

In one example of manufacturing a PV module, a plurality of PV cells are interconnected by electrically coupling PV module ribbons between electrodes of the plurality of PV cells. In some cases, the PV cells are connected in series to output an additive voltage. In other cases, the PV cells are connected in parallel to output an additive current. In yet other cases, the plurality of PV cells are connected in both series and parallel according to desired characteristics for output voltage and current. Typically, the PV cells are interconnected in two steps referred to as tabbing and stringing.

Tabbing is a process by which segments of PV module ribbon are electrically coupled to each PV cell of the PV module. More specifically, for each PV cell of the PV module, segments of PV module ribbon are electrically coupled (e.g., by soldering) to the electrodes on a surface of the PV cell so that a portion of each segment extends from the PV cell for coupling with adjacent cells. Stringing is a process by which tabbed PV cells are interconnected. Tabbed PV cells are reversed and disposed on a base in a desired configuration (e.g., in a row) so that extending portions of the PV module ribbon segments coupled to a first (front) surface of a particular PV cell align with corresponding electrodes on a second (back) surface of an adjacent PV cell. For each tabbed PV cell, the aligned PV module ribbon segments are electrically coupled (e.g., by soldering) to the corresponding electrodes of adjacent cells to create a string of PV cells.

As described herein, a light-capturing texture may be directly imparted to at least a portion of the PV module ribbons of the string of PV cells by stringing the tabbed PV cells using a textured base. In soldering the PV module ribbons to the second (back) surface of the tabbed PV cells, heat energy is released after solidification of the solder metal. At least some of this heat energy may transfer through the PV cell to the solder metal of the PV module ribbons on the first (front) side of the tabbed PV cells. When sufficient heat energy is transferred to the first (front) side ribbons, the relative solder metal is heated beyond its eutectic temperature. The solder metal reflows into the surface of the textured base and solidifies when cooled below its eutectic temperature. Based on the surface characteristics of the textured base, a light-capturing texture is imparted to those portions of the PV module ribbons on the first (front) side of the tabbed PV cells that reflow into the surface of the textured base.

Figure 1:
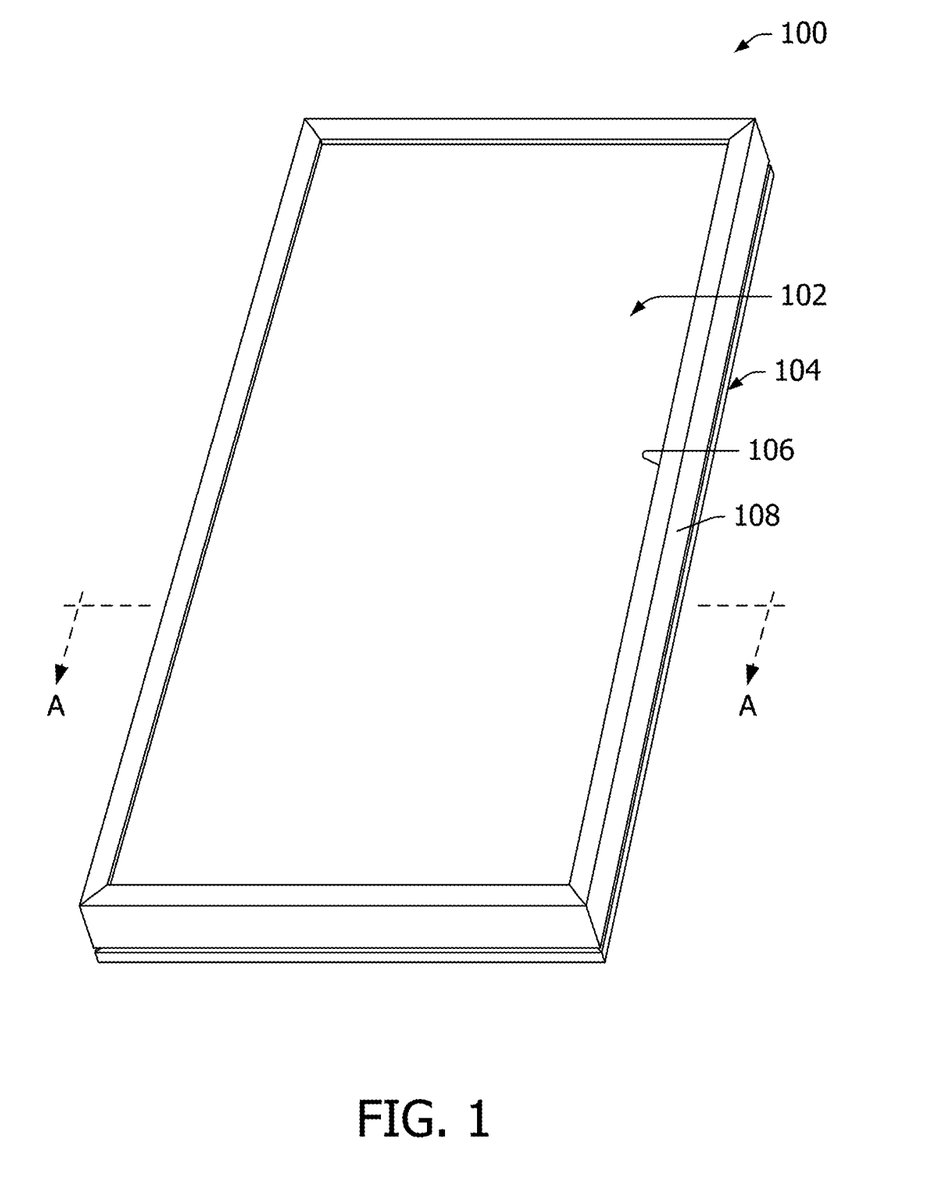
FIG. 1 is a perspective view of an example PV module.
Figure 2:
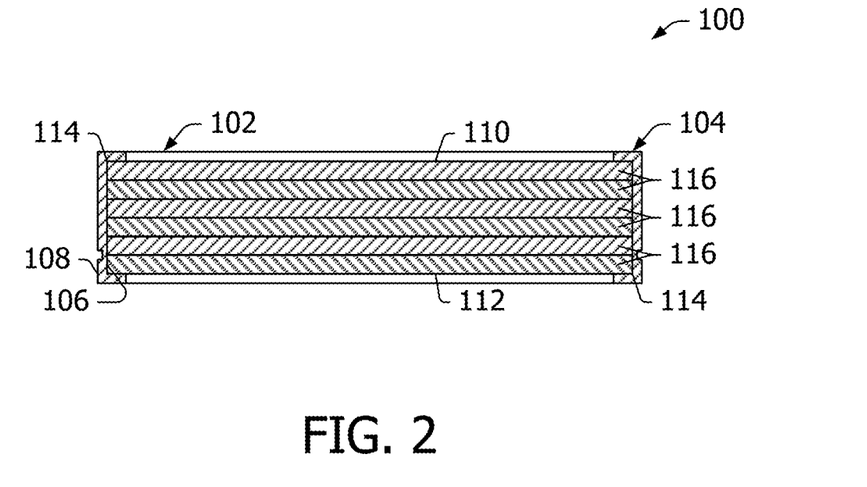
FIG. 2 is a cross-sectional view of the PV module shown in FIG. 1.

FIG. 1 is a perspective view of an example PV module 100. FIG. 2 is a cross-sectional view of PV module 100 taken along line A-A shown in FIG. 1. Referring to FIGS. 1 and 2, PV module 100 includes a laminate 102 and a frame 104 circumscribing laminate 102. PV module 100 may be rectangular, as shown in FIG. 1, or may be any suitable shape. In some embodiments, one or more PV module 100 may be arranged to create a PV array (not shown). In creating a PV array, PV module 100 may be shaped according to the particular implementation and/or design of the PV array.

Referring to FIG. 1, frame 104 circumscribes PV module 100 and is coupled to PV module 100. Frame 104 facilitates protecting laminate 102 and providing structural support for PV module 100. Frame 104 includes an inner surface 106 proximate to laminate 102 and an outer surface 108 distal to laminate 102. Frame 104 may be constructed using any suitable material such as, e.g., aluminum, rolled or stamped stainless steel, plastic, fiberglass, or carbon fiber. In some embodiments, frame 104 includes elements for securing PV module 100 to a mounting structure (not shown). In other embodiments, frame 104 includes elements for electrically coupling PV module 100 to other devices or to ground. In yet other embodiments, frame 104 includes elements for coupling PV module 100 to other PV modules for creating a PV array (not shown).

Referring to FIG. 2, laminate 102 of PV module 100 includes a top surface 110 and a bottom surface 112. Edges 114 extend between top surface 110 and bottom surface 108, and around laminate 102. Laminate 102 has a laminate structure including a plurality of layers 116. Layers 116 may include, e.g., glass layers, non-reflective layers, electrical connection layers, backing layers, and/or other suitable layers to enable PV module 100 to function as described herein. In some embodiments, laminate 102 of PV module 100 may include more or fewer layers 116, may have different layers 116, and/or may have different types of layers 116.

At least one of layers 116 of laminate 102 includes a plurality of PV cells (not shown). The PV cells function to generate electricity using incident light (e.g., from the sun) at the surface of the cell. Each PV cell includes electrodes to facilitate extracting the generated electricity from the PV cell. In manufacturing PV module 100, the plurality of PV cells are interconnected by electrically coupling PV module ribbons (not shown) between electrodes of adjacent cells. In one embodiment, PV module 100 includes a plurality of PV cells interconnected in both a series configuration and a parallel configuration, and PV module 100 is configured to generate a desired output voltage and a desired output current. In some embodiments, PV module 100 includes a plurality of PV cells interconnected in a series configuration to generate an additive voltage. In other embodiments, PV module 100 includes a plurality of PV cells interconnected in a parallel configuration to generate an additive current.

Figure 3A:
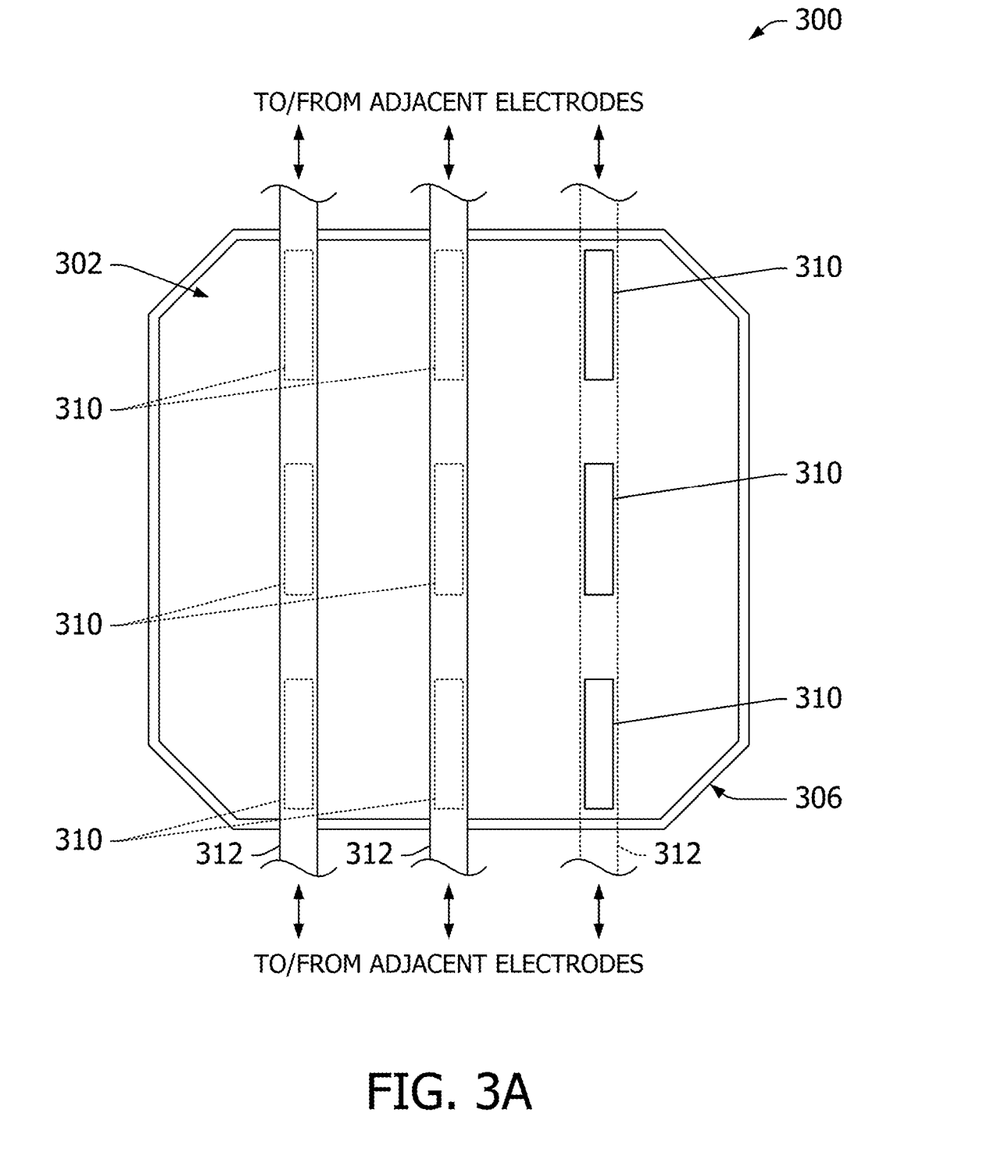
FIGS. 3A and 3B are schematic diagrams of an example PV cell that may be used to produce the PV module shown in FIG. 1.
Figure 3B:
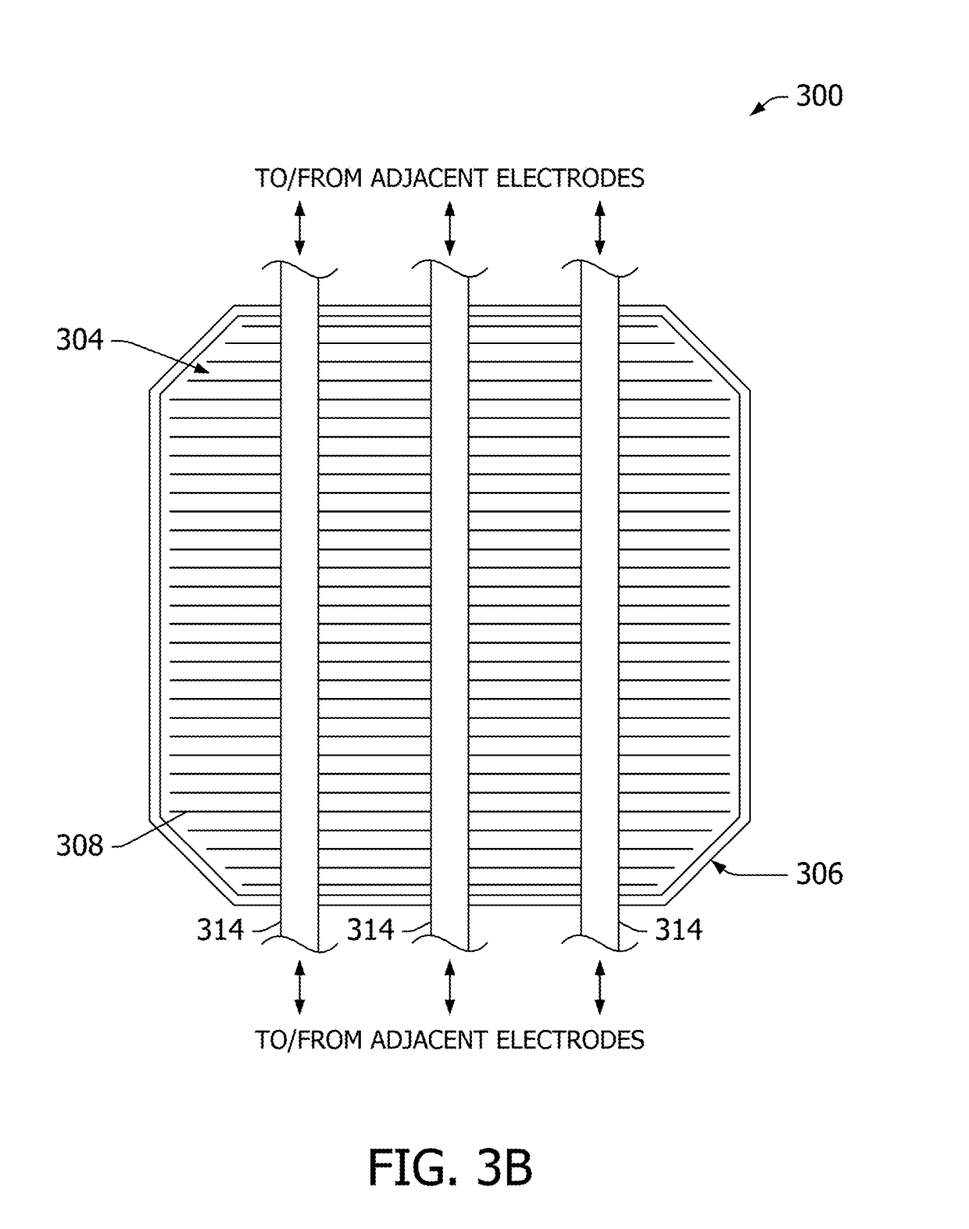

FIGS. 3A and 3B are schematic diagrams of an example PV cell 300 that may be used to produce a PV module such as, e.g., PV module 100 shown in FIGS. 1 and 2. FIG. 3A is a schematic diagram of example PV cell 300 including a view of a back surface 302 of cell 300. FIG. 3B is a schematic diagram of example PV cell 300 including a view of a front surface 304 of cell 300.

Referring to FIGS. 3A and 3B, PV cell 300 includes a photoactive wafer 306 for generating electricity using light incident on the surface (i.e., back surface 302 and/or front surface 304) of wafer 306. In some embodiments, wafer 306 is a crystalline silicon wafer. In other embodiments, wafer 306 is a monocrystalline silicon wafer, a polycrystalline silicon wafer, another crystalline silicon wafer, a thin film based wafer, or other suitable wafer to enable PV cell 300 to function as described herein. PV cell 300 may be a front diffused emitter or a heterojunction PV cell. In other embodiments, PV cell 300 may be any other suitable type of PV cell. In the example embodiment, PV cell 300 is a pseudo-square shape. In other embodiments, PV cell 300 may be any suitable shape for producing PV modules and/or PV arrays in various different shapes.

PV cell 300 also includes a plurality of finger electrodes 308 manufactured on at least front surface 304 of photoactive wafer 306. Finger electrodes 308 are electrically conductive electrodes coupled to and extending in parallel across the surface of wafer 306. Finger electrodes 308 conduct electricity generated by PV cell 300. Finger electrodes 308 are manufactured on photoactive wafer 306 by screen printing, electroless plating, electrochemical plating, plasma vapor deposition (PVD), sputtering or evaporation, or otherwise disposing a suitably conductive material on the surface of wafer 306. In some embodiments, finger electrodes 308 are silver (Ag) and/or copper (Cu) electrodes. In other embodiments, finger electrodes 308 are made from any other suitably conductive metal, alloy, and/or non-metallic material including, e.g., aluminum, nickel, tin, and/or titanium. In yet other embodiments, finger electrodes 308 are made from any electrically conductive, suitably low resistance, and suitably inexpensive material, and may be made from a material that includes no silver (Ag) or is substantially silver free.

Referring to FIG. 3A, PV cell 300 includes a plurality of bus electrodes 310 manufactured on back surface 302 of photoactive wafer 306. Bus electrodes 310 are electrically conductive electrodes coupled to and extending in parallel across the surface of wafer 306. Moreover, bus electrodes 310 are coupled to and extend perpendicular to finger electrodes 308. In the example embodiment, PV cell 300 includes nine bus electrodes 310 arranged in three groups, where bus electrodes 310 for each group are aligned longitudinally across photoactive wafer 306 and are sometimes referred to as a segmented bus bar. In other embodiments, PV cell 300 may include fewer or more bus electrodes 310, and bus electrodes 310 may be any suitable size and/or shape to enable PV cell 300 to function as described herein.

PV cell 300 also includes a plurality of PV module ribbons 312 coupled to back surface 302 of photoactive wafer 306. In the example embodiment, PV module ribbons 312 are coupled to bus electrodes 310 and extend across each longitudinally aligned group of bus electrodes 310. In other embodiments, PV module ribbons 312 may be coupled to photoactive wafer 306 by finger electrodes 308 in addition to, or in alternative to, bus electrodes 310. PV module ribbons 312 include a conductive core (not shown) covered by a tin-lead alloy solder metal. Alternatively, the conductive core may be covered by any suitable solder metal to enable PV module ribbons 312 to function as described herein.

Referring to FIG. 3B, PV cell 300 includes a plurality of PV module ribbons 314 coupled to front surface 304 of photoactive wafer 306. PV module ribbons 314 are coupled to finger electrodes 308 and extend longitudinally across photoactive wafer 306 and transverse across finger electrodes 308. In some embodiments, PV module ribbons 314 include a conductive core (not shown) covered by a tin-lead alloy solder metal. In other embodiments, the conductive core may be covered by any suitable solder metal to enable PV module ribbons 314 to function as described herein.

In producing a PV module (e.g., PV module 100), one or more PV cell 300 are interconnected by soldering PV module ribbons 312 and 314 between adjacent electrodes on back surface 302 and front surface 304, respectively. In one embodiment, one or more PV cell 300 are interconnected by soldering PV module ribbons 312 between bus electrodes 310 of adjacent cells (not shown) and soldering PV module ribbons 314 between finger electrodes 308 of adjacent cells to form a string of PV cells (not shown). In another embodiment, one or more PV cell 300, or one or more string of PV cells, are interconnected by soldering PV module ribbons 312 and 314 between other electrodes, e.g., around the perimeter of laminate 102 (shown in FIGS. 1 and 2). In the example embodiment, in producing strings of PV cells, PV module ribbons 312 and 314 (shown cutoff at the top and bottom of FIGS. 3A and 3B for simplicity) are soldered to electrodes on the opposite surface of adjacent PV cells. More specifically, PV module ribbons 312 are coupled between electrodes 310 on back surface 302 of PV cell 300 and electrodes on the front surface of a first adjacent PV cell (not shown), and PV module ribbons 314 are coupled between electrodes 308 on front surface 304 of PV cell 300 and electrodes on the back surface of a second adjacent PV cell (not shown).

In the example embodiments described herein, PV module ribbons 312 and/or 314 at least partially obscure the photoactive areas of PV cell 300. In some cases, this may reduce the amount of incident light on the photoactive areas by up to about 5%. When the surface of PV module ribbons 312 and/or 314 is reflective, incoming light is reflected off the surface of the ribbons and away from PV cell 300. Some of the light reflected off the surface of PV module ribbons 312 and/or 314 may be reflected back to the photoactive areas of PV cell 300 by other layers 116 of laminate 102 (both shown in FIG. 2). The amount of light reflected back to photoactive areas of PV cell 300 may be increased by texturing the surface of PV module ribbons 312 and/or 314. For example, a light-capturing texture may result in the diffusion of incoming light reflected by the surface. At least some of the diffused, reflected light leaves the light-capturing surface at a reduced angle relative to the cell's surface, increasing the likelihood that subsequent reflections will occur and the light will reach the photoactive areas of the cell.

Figure 4:
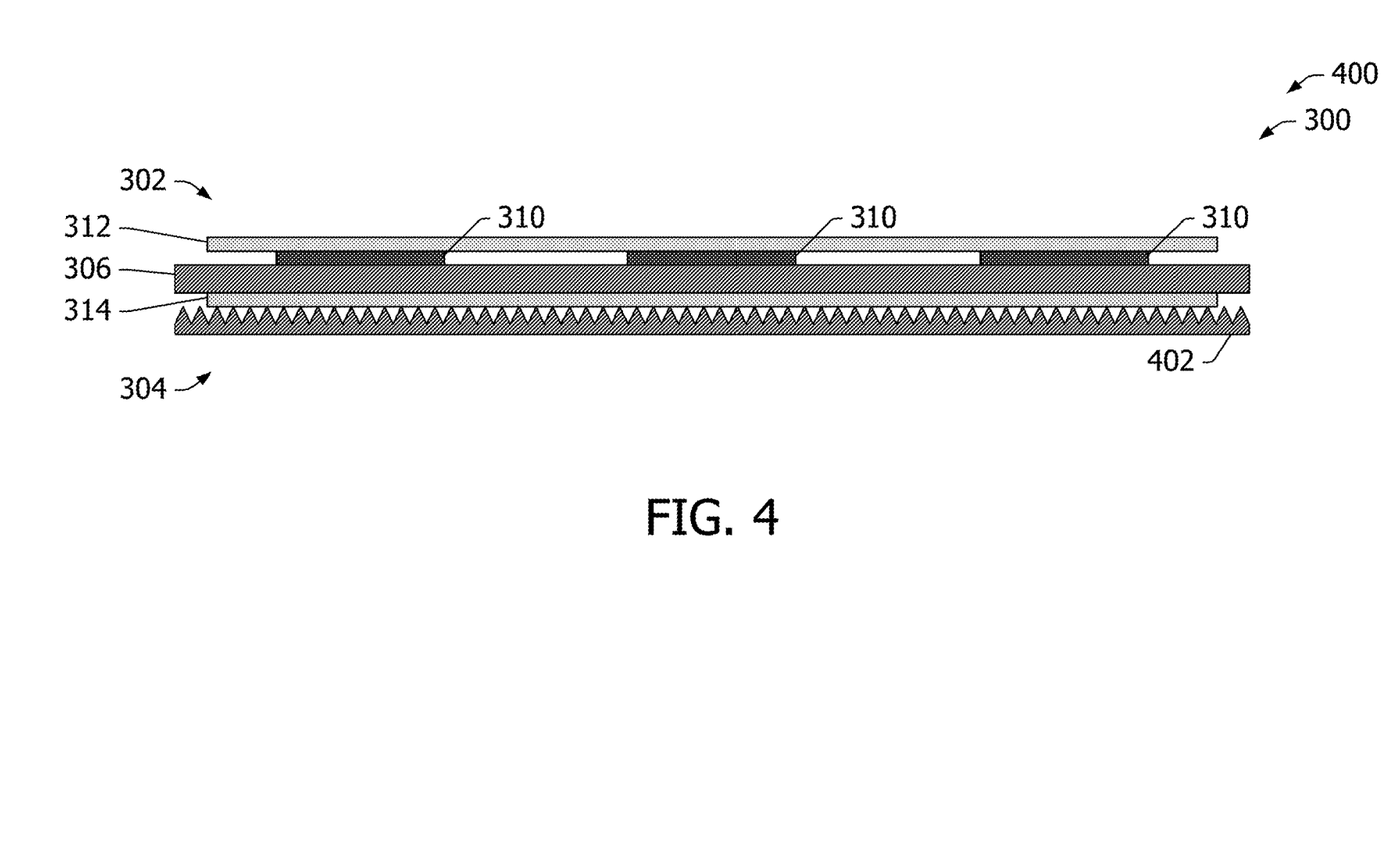
FIG. 4 is a diagram of an example system for imparting light-capturing textures to PV module ribbons.
Figure 5:
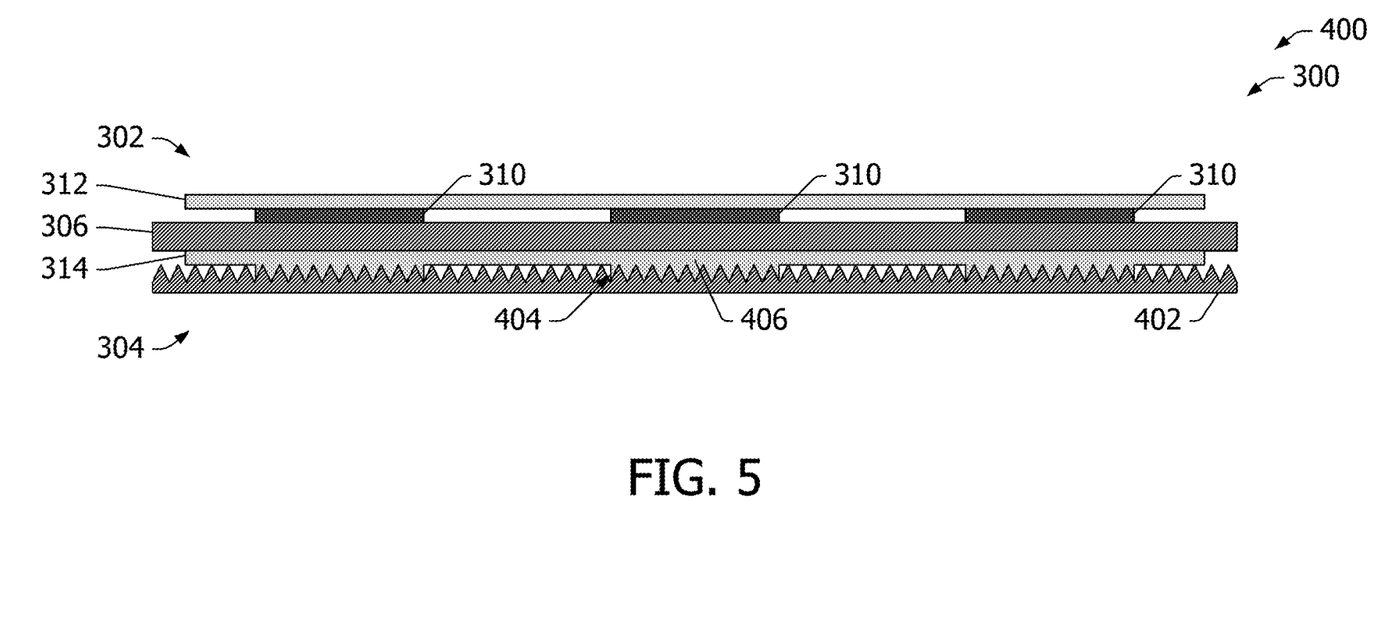
FIG. 5 is another diagram of the system shown in FIG. 4.

FIGS. 4 and 5 illustrate an example system 400 including a textured base 402 for imparting a light-capturing texture 404 to a PV module ribbon of a PV cell (e.g., PV module ribbons 312 and/or 314 of PV cell 300) using textured base 402. FIG. 4 includes textured base 402 and PV cell 300, where PV cell 300 is positioned adjacent to textured base 402 at front surface 304 and PV module ribbons 314 of PV cell 300 are substantially contacting textured base 402. FIG. 5 includes light-capturing texture 404 imparted to at least a portion 406 of PV module ribbon 314 by textured base 402.

Referring to FIGS. 4 and 5, system 400 enables producing a PV module (not shown) including PV cell 300 and imparting light-capturing texture 404 to portion 406 of PV module ribbon 314 by textured base 402 during manufacture of the PV module. Textured base 402 is shown as triangular and/or pyramid shaped, and may be any other shape to enable system 400 to function as described herein. For example, textured base 402 may have any shape that will reflect light normal to the direction of the ribbon 314, rather than along the length of the ribbon 314. As shown in FIG. 4, PV module ribbons 314 (sometimes referred to as tabbing ribbons) are electrically coupled to electrodes 308 (shown in FIG. 3) on front surface 304 of photoactive wafer 306, and PV module ribbons 312 (sometimes referred to as stringing ribbons) are positioned across bus electrodes 310 on back surface 302 of PV cell 300 and are ready to be coupled (e.g., soldered) to bus electrodes 310 to manufacture the PV module. As shown in FIG. 5, soldering PV module ribbons 312 to bus electrodes 310 on back surface 302 directly imparts light-capturing texture 404 to portion 406 of PV module ribbon 314 on front surface 304.

In the example embodiment, light-capturing texture 404 is imparted to at least portion 406 of PV module ribbons 314 during production of the PV module including PV cell 300. PV module ribbons 314 are electrically coupled to PV cell 300 in a process sometimes referred to as tabbing. More specifically, PV module ribbons 314 are soldered to electrodes 308 (shown in FIG. 3) on front surface 304 of PV cell 300. In a process sometimes referred to as stringing, PV cell 300 is positioned so that front surface 304 is facing textured base 402, and PV module ribbons 314 are substantially contacting textured base 402. PV module ribbons 312 are positioned across bus electrodes 310 on back surface 302 of PV cell 300. PV module ribbons 312 are electrically coupled with PV cell 300 by soldering ribbons 312 to bus electrodes 310.

In soldering PV module ribbons 312 to bus electrodes 310, heat energy is applied to melt the solder metal coating of ribbons 312. The applied heat energy is removed and the solder metal coating of ribbons 312 cools and solidifies. In the example embodiment, heat energy is released by the solder metal coating after solidification. At least some of the released heat energy transfers across PV cell 300 in areas covered by bus electrodes 310, from PV module ribbons 312 on back surface 302 to PV module ribbons 314 on front surface 304. When sufficient heat energy is transferred to PV module ribbons 314, the relative solder metal is heated beyond its eutectic temperature. The relative solder metal of PV module ribbons 314 reflows into the surface of textured base 402 and solidifies when cooled below its eutectic temperature. A relief of textured base 402 is imparted to PV module ribbons 314 when cooled. By controlling the surface characteristics of textured base 402, light-capturing texture 404 is imparted to PV module ribbons 314 as the relief of textured base 402. As shown in FIG. 5, light-capturing texture 404 is imparted to at least portion 406 of PV module ribbons 314.

FIGS. 6A-6E are photographic illustrations of example light-capturing textures 600 generated by a system for directly imparting light-capturing textures using a textured base, such as system 400 and textured base 402 (both shown in FIGS. 4 and 5). Example light-capturing textures 600 are imparted to PV module ribbons 602 during production of relative PV modules (not shown). More specifically, example light-capturing textures 600 are imparted to the surface of PV module ribbons 602 contacting textured base 402 when soldering other PV module ribbons (not shown) on the opposing side of a PV cell 604. In the example embodiment, PV cell 604 is similar to PV cell 300 shown in FIG. 3. In other embodiments, PV cell 604 may be any suitable PV cell to enable system 400 to function as described herein.

Figure 6A:
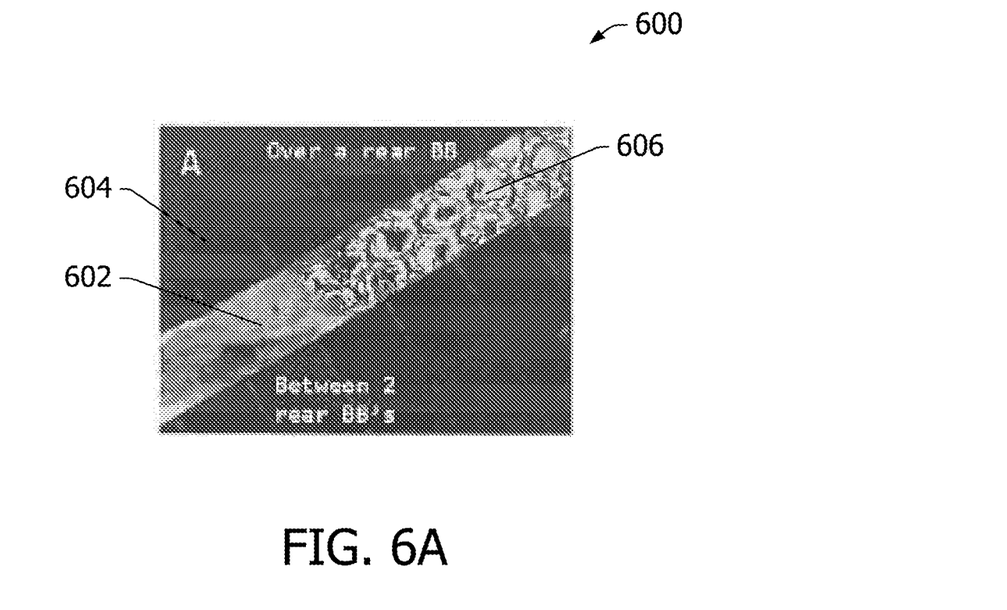
FIGS. 6A-6E are photograph of example light-capturing textures generated by the system shown in FIGS. 4 and 5.

Referring to FIG. 6A, light-capturing textures 600 include an inverted pyramid texture 606 as shown in FIGS. 4 and 5. Textured base 402 is a laminated glass having inverted pyramid texture 606 on a surface (not shown) of the glass. Inverted pyramid texture 606 is imparted to PV module ribbon 602 when soldering ribbons on the reverse side of PV cell 604 using the laminated glass base. Moreover, inverted pyramid texture 606 is imparted to the portion of PV module ribbon 602 that is positioned on the front surface of PV cell 604 and opposite of bus electrodes (not shown) on the back surface of PV cell 604.

Figure 6B:
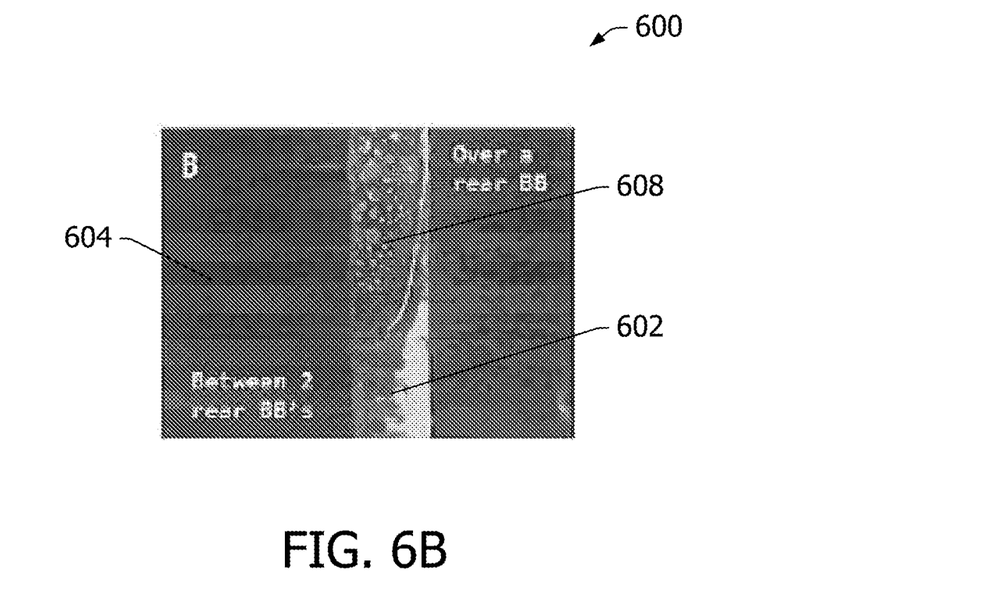

Referring to FIG. 6B, light-capturing textures 600 include a matte texture 608. Textured base 402 is a non-anti-reflective coated glass having matte texture 608 on a surface (not shown) of the glass. Matte texture 608 is imparted to PV module ribbon 602 when soldering ribbons on the reverse side of PV cell 604 using the coated glass base. Moreover, matte texture 608 is imparted to the portion of PV module ribbon 602 that is positioned on the front surface of PV cell 604 and opposite of bus electrodes (not shown) on the back surface of PV cell 604.

Figure 6C:
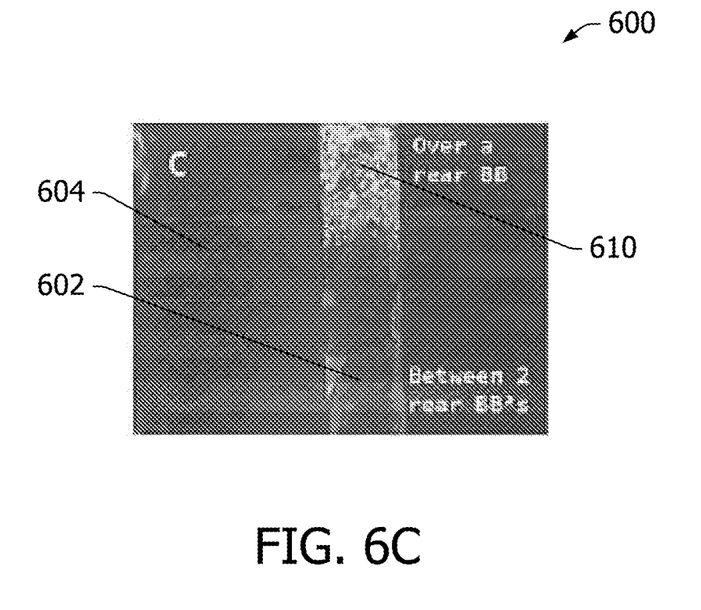

Referring to FIG. 6C, light-capturing textures 600 include a smooth texture 610. Textured base 402 is an un-textured glass having smooth texture 610 on a surface (not shown) of the glass. Smooth texture 610 is imparted to PV module ribbon 602 when soldering ribbons on the reverse side of PV cell 604 using the glass base. Moreover, smooth texture 610 is imparted to the portion of PV module ribbon 602 that is positioned on the front surface of PV cell 604 and opposite of bus electrodes (not shown) on the back surface of PV cell 604.

Figure 6D:
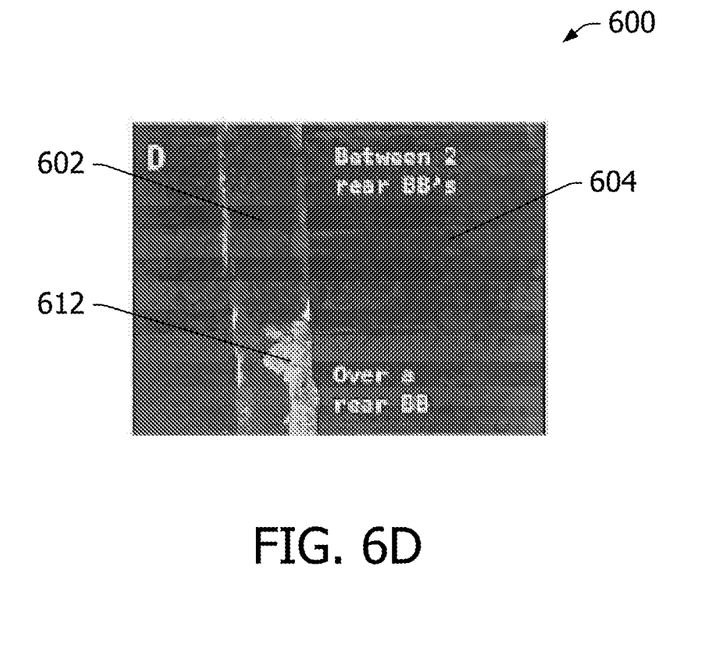

Referring to FIG. 6D, light-capturing textures 600 include an uneven texture 612. Textured base 402 is a soldering fixture having uneven texture 612 on a surface (not shown) of the fixture. Uneven texture 612 is imparted to PV module ribbon 602 when soldering ribbons on the reverse side of PV cell 604 using the soldering fixture. Moreover, uneven texture 612 is imparted to the portion of PV module ribbon 602 that is positioned on the front surface of PV cell 604 and opposite of bus electrodes (not shown) on the back surface of PV cell 604.

Figure 6E:
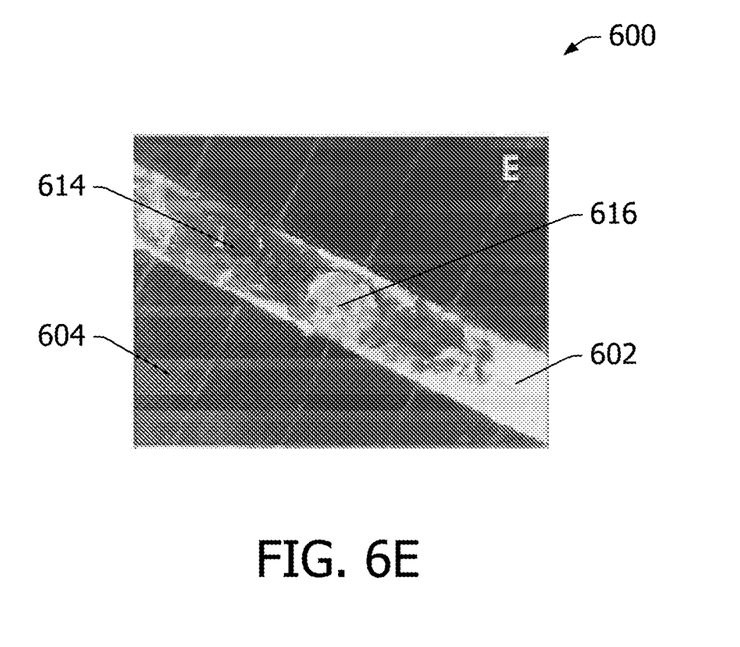

Referring to FIG. 6E, light-capturing textures 600 include a patterned texture 614. Textured base 402 is a component of a cell stringing device (not shown) having patterned texture 614 on a surface (not shown) of the device. Patterned texture 614 is imparted to PV module ribbon 602 when soldering ribbons on the reverse side of PV cell 604 using the cell stringing device. Moreover, patterned texture 614 is imparted to the portion of PV module ribbon 602 that is positioned on the front surface of PV cell 604 and opposite of bus electrodes (not shown) on the back surface of PV cell 604. Further, the cell stringing device includes pins for soldering ribbons. Patterned texture 614 is substantially uniform over those portions of PV module ribbon 602 except at a position 616 where one of the pins makes contact during soldering.

Figure 7:
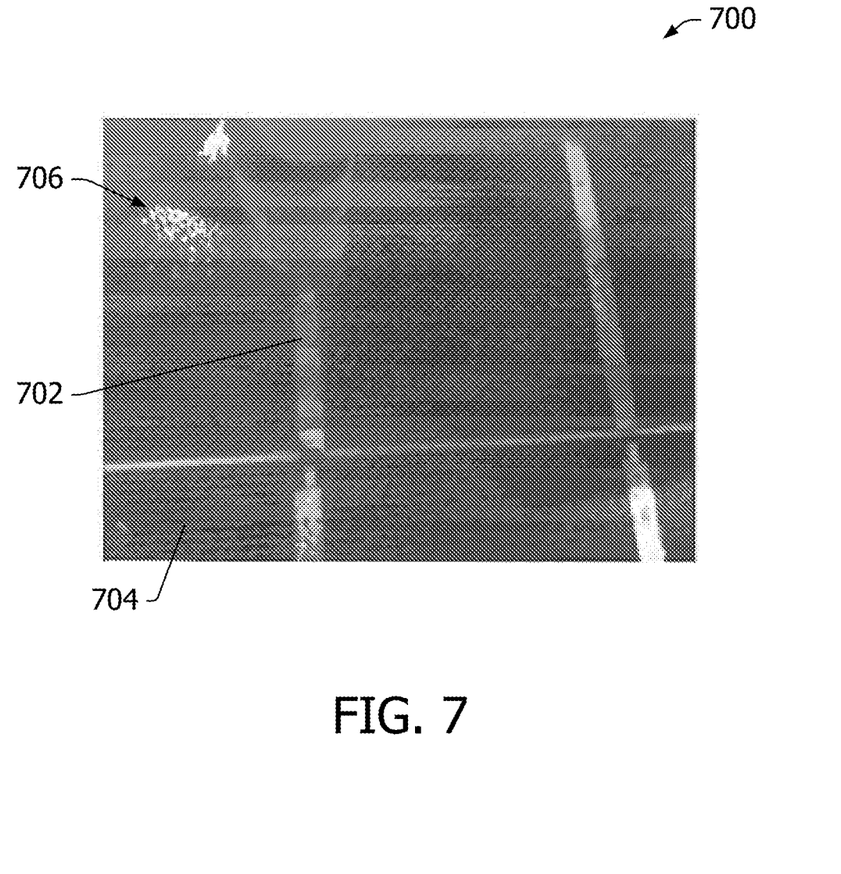
FIG. 7 is a photograph of an experiment to determine light scatter for an un-textured PV module ribbon.
Figure 8:
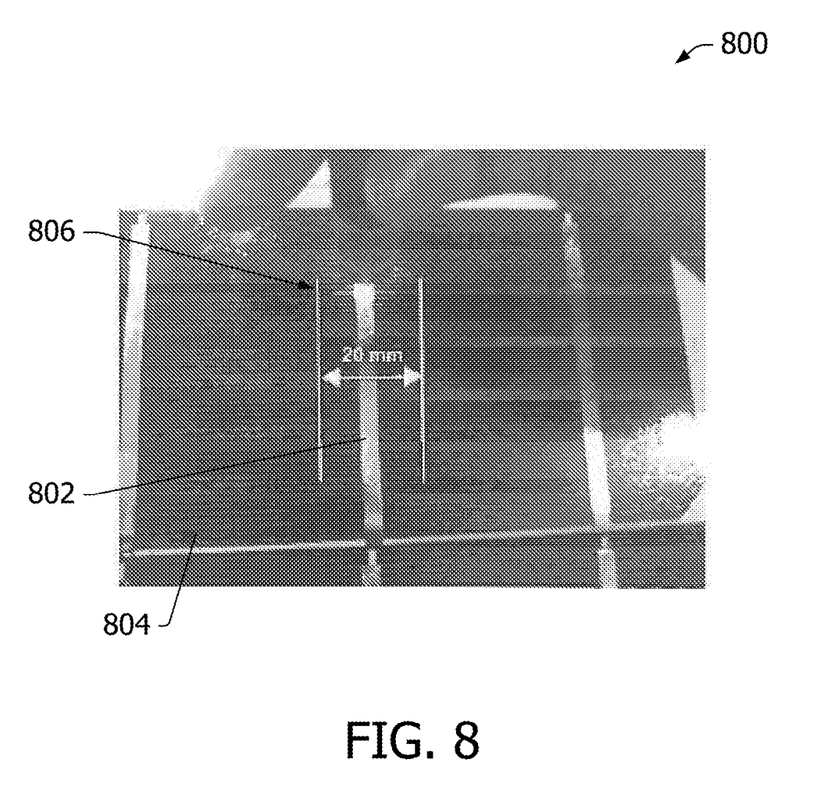
FIG. 8 is a photograph of an experiment to determine light scatter for a textured PV module ribbon.

FIGS. 7 and 8 are photographic illustrations of experiments to determine light scatter for PV module ribbons based on the texture of the PV module ribbon. FIG. 7 includes a system 700 including light scatter for an un-textured PV module ribbon 702. FIG. 8 includes a system 800 including light scatter of a textured PV module ribbon 802 generated using a textured base (not shown) such as, e.g., textured base 402 shown in FIGS. 4 and 5. Referring to FIGS. 7 and 8, the experiments illustrate enhanced light scatter for PV module ribbons textured during production of PV modules. In the experiments, a device is used to illuminate the PV module ribbons and the resulting light scatter is observed. The resulting light scatter is quantified by measuring the width of light scatter on the surface of the PV cell.

Referring to FIG. 7, system 700 includes an un-textured PV module ribbon 702 coupled with a PV cell 704. In the example embodiment, PV cell 704 is similar to PV cell 300 shown in FIG. 3. In other embodiments, PV cell 704 may be any suitable PV cell to enable system 700 to function as described herein. In producing a PV module (not shown), PV cell 704 is electrically coupled with other PV cells (not shown) by soldering PV module ribbon between the cells. Un-textured PV module ribbon 702 is generated when soldering relative PV module ribbon (not shown) on the reverse side of PV cell 704 when producing the PV module. In the example embodiment, the experiment shows that a light scatter 706 for un-textured PV module ribbon 702 is substantially zero (i.e., there is very little to no light scatter for un-textured PV module ribbon).

Referring to FIG. 8, system 800 includes a textured PV module ribbon 802 generated using a textured base (not shown) and coupled with a PV cell 804. In the example embodiment, PV cell 804 is similar to PV cell 300 shown in FIG. 3. In other embodiments, PV cell 804 may be any suitable PV cell to enable system 800 to function as described herein. In producing a PV module (not shown), PV cell 804 is electrically coupled with other PV cells (not shown) by soldering PV module ribbon between the cells. Textured PV module ribbon 802 is generated when soldering relative PV module ribbon (not shown) on the reverse side of PV cell 804 when producing the PV module. In the example embodiment, the experiment shows that a light scatter 806 for textured PV module ribbon 802 is about 20 mm.

Referring to FIGS. 7 and 8, experiments conducted for system 700 and system 800 show that textured PV module ribbon effects enhanced light scatter relative to un-textured PV module ribbon. Textured PV module ribbons such as, e.g., textured PV module ribbon 802, include light-capturing textured directly imparted when producing PV modules. The overall efficiency of PV cells, PV modules, and/or PV arrays manufactured with the light-capturing texture is enhanced while the cost and/or complexity of producing them are substantially maintained.

The example methods and systems described herein produce solar cells with textured solar module ribbons. The resulting cells are able to capture light more efficiently than cells with untextured ribbons. Solar modules having cells produced as described herein capture more have a greater amount of light incident on the surface of the cells and produce more electricity than modules with untextured ribbons. Moreover, the example methods and systems produce solar cells with textured ribbons without adding any significant extra effort or cost over the cost of producing solar cells without textured ribbons.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

When introducing elements of the present disclosure or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

What is claimed is:

1. A method for texturing a photovoltaic module ribbon on a photovoltaic cell including a plurality of first electrodes on a first side and a plurality of second electrodes on a second side, said method comprising:
   coupling a first photovoltaic module ribbon to the plurality of first electrodes;
   positioning the photovoltaic cell on a textured base having a texture embodied thereon, wherein the first photovoltaic module ribbon is substantially contacting the texture;
   coupling a second photovoltaic module ribbon to the plurality of second electrodes; and
   transferring the texture of the textured base to the first ribbon using heat energy released when the second photovoltaic module ribbon is coupled to the plurality of second electrodes,
   wherein the texture has a pyramidal shape.

2. The method according to claim 1 wherein coupling the first photovoltaic module ribbon to the plurality of first electrodes includes soldering the first photovoltaic module ribbon to the plurality of first electrodes.

3. A photovoltaic cell produced by the method of claim 1.

4. A photovoltaic module including a plurality of photovoltaic cells produced by the method of claim 1.

5. The method according to claim 2 wherein coupling the second photovoltaic module ribbon to the plurality of second electrodes includes soldering the second photovoltaic module ribbon to the plurality of second electrodes.

6. The method according to claim 5 wherein the heat energy is released when a solder metal of the second photovoltaic module ribbon cools below a threshold temperature.

7. The method according to claim 6 wherein the threshold temperature is a eutectic temperature of the solder metal.

8. The method according to claim 1 further comprising receiving heat energy at the first photovoltaic module ribbon when the second photovoltaic module ribbon is coupled to the plurality of second electrodes.

9. The method according to claim 8 wherein the first photovoltaic module ribbon includes a solder metal, and the solder metal reflows into the texture of the textured base when the heat energy is received at the first photovoltaic module ribbon.

10. A system for imparting texturing to a photovoltaic module ribbon on a photovoltaic cell including a first side and a second side, said system comprising:
   a textured base to receive a photovoltaic cell with the first side adjacent the textured base, the textured base including a texture to be imparted to a first photovoltaic module ribbon on the first side of the photovoltaic cell when a second photovoltaic module ribbon is coupled to the second side of the photovoltaic cell,
   wherein the texture has a pyramidal shape.

* * * * *